(12) United States Patent
Roger

(10) Patent No.: US 8,373,487 B1
(45) Date of Patent: Feb. 12, 2013

(54) TRUE RMS POWER MEASUREMENT

(75) Inventor: Frederic Roger, Santa Clara, CA (US)

(73) Assignee: Scintera Networks, Inc., Sunnyvale, CA (US)

( * ) Notice: Subject to any disclaimer, the term of this patent is extended or adjusted under 35 U.S.C. 154(b) by 0 days.

(21) Appl. No.: 13/220,480

(22) Filed: Aug. 29, 2011

(51) Int. Cl.
*G06F 7/64* (2006.01)
(52) U.S. Cl. ............... 327/336; 327/347; 327/348
(58) Field of Classification Search .......... 327/336, 327/337, 346–348; 341/155, 158; 702/60, 702/64
See application file for complete search history.

(56) References Cited

U.S. PATENT DOCUMENTS 4,254,406 A * 3/1981 Meares .................. 341/158
5,101,206 A    3/1992 Riedel
5,321,403 A * 6/1994 Eng et al. ................ 341/168

* cited by examiner

*Primary Examiner* — Long Nguyen
(74) *Attorney, Agent, or Firm* — Edward C. Kwok; Hogan Lovells US LLP

(57) ABSTRACT

Systems and methods are provided for power measurement of signals such that the power measurement is insensitive to PVT variations of the measurement systems. A power measurement system includes an analog squarer circuitry, an integrating ADC, and a controller. The squarer circuitry calculates the power of a signal whose power is to be measured while the integrating ADC integrates the calculated power over a runup interval to generate an integrated power. The squarer circuitry also calculates the power of a reference for the integrating ADC to de-integrate the integrated power over a rundown interval. The power measurements are independent of PVT variations of the analog squarer circuitry and integrating ADC. The controller digitally controls the runup interval and measures the rundown interval to provide digitized power measurements. The analog squarer circuitry have replica squarer circuits. Process dependent mismatches between the replica analog circuitry may be removed through a calibration process.

20 Claims, 5 Drawing Sheets

TRUE RMS POWER MEASUREMENT

BACKGROUND

1. Field of the Invention

The present invention generally relates to power measurements and, more particularly to true Root Mean Square ("RMS") power measurements of signals.

2. Related Art

In communication devices and signal processing applications, power measurements of time varying signals are frequently made. One type of power measurement measures the average power or RMS of a signal, which may be obtained by integrating the square of the signal over an integration interval and then dividing this integral by the integration interval.

An important performance metric of power measurement devices is the accuracy of the power measurements over a dynamic range of the signal. In a conventional RMS power measurement device, this measurement accuracy may be limited by the sensitivity of the device to variations in device process, voltage, or temperature (PVT). The measurement accuracy may also depend on the length of the integration interval, which is frequently a function of the statistics of the signal to be measured. Therefore, it is often desirable to change the integration interval to obtain a desired measurement accuracy. A conventional power measurement device may use a capacitor to change an integration interval. However, such a capacitor is often too big to be integrated into the power measurement device, making any change to the integration time difficult and costly. Furthermore, many power measurement devices generate power measurements as analog signals, so that extra circuitry is needed to obtain digital outputs required for subsequent processing. Such circuitry not only incurs extra cost but may also be subject to PVT variations, compounding the PVT sensitivity of the power measurement devices. Accordingly, there is a need for power measurement devices whose measurement accuracy is independent of PVT variations, whose integration interval is easily configurable, and whose output is digital.

SUMMARY

Systems and methods are provided to measure the average power or Root Mean Square ("RMS") of a signal using analog squarer circuitry and an integrating analog-to-digital converter ("ADC"). An integrating ADC removes the sensitivity of the power measurement to process, voltage, and temperature (PVT) variations. An integration interval for the power measurement may also be controlled digitally to accommodate various types of signals. In addition, power measurement outputs from the integrating ADC are inherently digital outputs. An integration resistor and a capacitor that determine a time constant of the integrating ADC is also integrated into the integrating ADC to reduce or simplify a bill of material (BOM). Furthermore, replica analog power squarer circuits may be used with the integration ADC to improve the performance of the power measurement. In addition, process-dependent mismatches between the replica power squarer circuits may be removed through a calibration procedure.

In accordance with one or more embodiments of the present invention, an apparatus for power measurement is disclosed. The apparatus includes a signal squarer module that is used to generate a power of an input signal. The apparatus also includes a reference squarer module that is used to generate a power of a known reference signal. The apparatus further includes a signal switch which provides the power of the input signal to an integration module during a programmable runup interval. The apparatus further includes a reference switch which provides the power of the reference signal to the integration module during a rundown interval following the runup interval is complete. The apparatus further includes the integrating module that is used to integrate the power of the input signal over the runup interval, thereby building up an integrated voltage. The integrating module also receives the negative of the power of the reference signal to de-integrate the integrated voltage over the rundown interval. The apparatus further includes a comparator that is used to generate a detect signal when the integrated voltage completely de-integrates over the rundown interval. The apparatus further includes a controller that determines and controls the runup interval. The controller also receives the detect signal, measures the rundown interval, and generates a digital signal proportional to the average power of the input signal over the runup interval.

In accordance with one or more embodiments of the present invention, a method for calibrating a power measurement system is disclosed. The method includes providing a power measurement system that includes a signal squarer module that is used to generate a power of an input signal. The power measurement system also includes a reference squarer module that is used to generate a power of a known reference signal. The power of the input signal and the power of the reference signal are dependent on process variations of the signal squarer module and the reference squarer module, respectively. The power measurement system further includes an integrating analog-to-digital converter (ADC) for integrating the power of the input signal over a programmable runup interval so as to build up an integrated voltage. The integrating ADC also receives the negative of the power of the reference power to de-integrate the integrated voltage over a rundown interval. The integrating ADC further measures the rundown interval from the start of the rundown interval to when the integrated voltage completely de-integrates. The integrating ADC further calculates the average power of the input signal over the runup interval.

The method for calibrating the power measurement system includes forcing the input signal to a known calibration voltage. The method also includes measuring the rundown interval with the input signal forced to the known calibration voltage. The method further includes applying a baseline signal having a known average power as the input signal. The method further includes measuring the rundown interval with the baseline signal applied. The method further includes generating one or more calibrated parameters using the rundown interval with the input signal forced to the known calibration voltage, the rundown interval with the baseline signal applied, and the known average power of the baseline signal.

In accordance with one or more embodiments of the present invention, a machine readable medium is used to store non-transitory machine-readable instructions which are executed by one or more processors of a device. The execution of the instructions causes the device to connect to a power measurement system. The power measurement system is used to integrate power of an input signal over a known runup interval to build up an integrated voltage. The power measurement system also applies a reference signal to de-integrate the integrated voltage over a rundown interval.

The execution of the instructions also causes the device to force the input signal to a known calibration voltage. The execution of the instructions also causes the device to measure the rundown interval with the input signal forced to the known calibration voltage. The execution of the instructions further causes the device to apply a baseline signal having a known average power as the input signal. The execution of the instructions further causes the device to measure the rundown interval with the baseline signal applied. The execution of the instructions further causes the device to generate a calibrated parameter using the rundown interval with the input signal forced to the known calibration voltage, the rundown interval with the baseline signal applied, and the known average power of the baseline signal. The execution of the instructions further causes the device to apply a third signal as the input signal. The execution of the instructions further causes the device to measure the rundown interval with the third signal applied. The execution of the instructions further causes the device to generate an average power of the third signal using the rundown interval with the third signal applied and the calibrated parameter. The average power is independent of process variations of the power measurement system.

The scope of the invention is defined by the claims. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE FIGURES

Embodiments of the present invention and their advantages are best understood by referring to the detailed description that follows. It should be appreciated that like reference numerals are used to identify like elements illustrated in one or more of the figures.

DETAILED DESCRIPTION

Systems and methods are provided for measuring power of a signal such that the measured power is insensitive to PVT variations of the measurement systems. In various embodiments, a power measurement system of the present invention includes replica analog squarer circuitries, an integrating ADC, and a controller. A first analog squarer circuitry generates the square of the signal to yield the instantaneous power of the signal. The integrating ADC integrates the instantaneous power of the signal over a programmable integration interval to build up an integrated voltage at the output of the ADC. A second analog squarer circuitry generates the square of a known reference signal. After the integration interval, the integrating ADC receives the square of the reference signal to de-integrate the integrated voltage over a de-integration interval. The de-integration interval is measured as the time it takes for the integrated voltage to completely de-integrate. The controller digitally controls the integration interval and provides digitized power measurements from the integration interval, the known reference signal, and the measured de-integration interval. Measuring power with replica analog squarer circuitries and an integrating ADC makes the power measurements independent of voltage and temperature variations of the analog squarer circuitries, and independent of PVT variations of the integrating ADC. However, a process-dependent mismatch may develop between the replica analog squarer circuitries. Through a calibration process, the mismatch may be removed so that the power measurements are also independent of process variations of the replica analog squarer circuitries.

Figure 1:
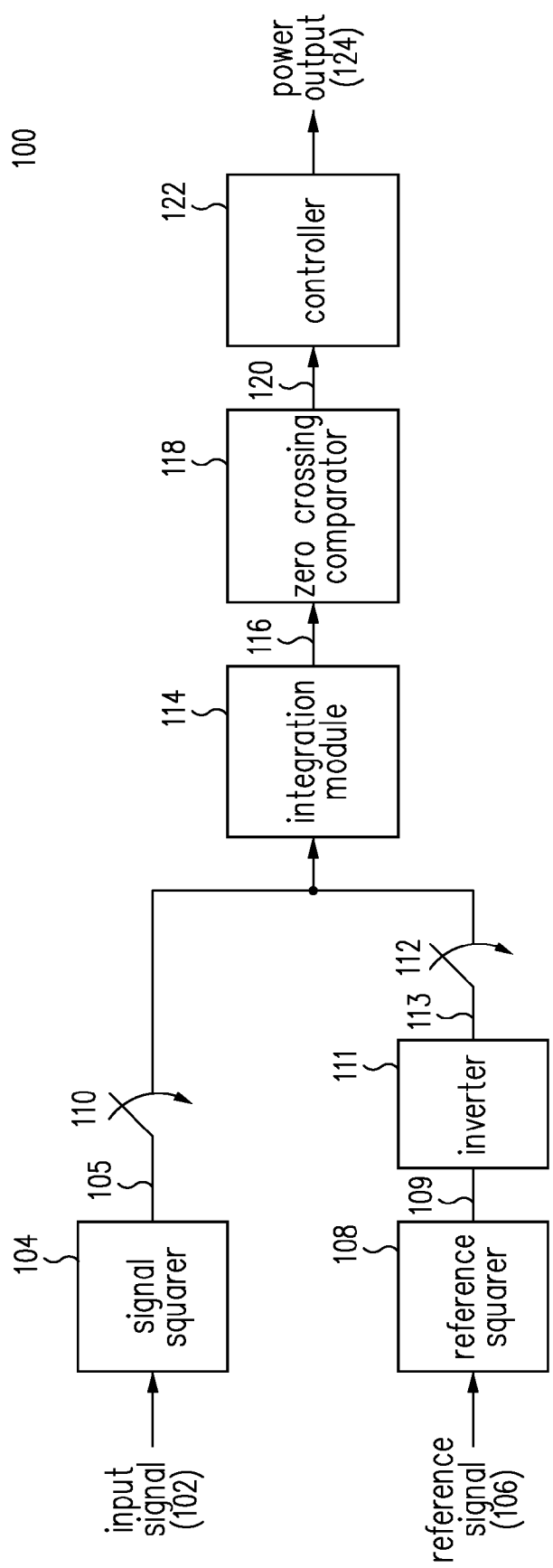
FIG. 1 shows a functional block diagram of a system that is used to generate a power measurement of a signal using replica analog squarer circuits and an integrating ADC, according to one or more embodiments of the present invention.

FIG. 1 shows a functional block diagram of a system that is used to generate a power measurement of a signal using replica analog squarer circuits and an integrating ADC, according to one or more embodiments of the present invention. The replica analog squarer circuits include a signal squarer 104 and a reference squarer 108. Signal squarer 104 and reference squarer 108 may have identical circuitry. Each squarer circuit generates an output value which represents a square of the magnitude of its input signal, where the square of the input signal may be further added to include an offset value and multiplied by a gain. For example, signal squarer 104 receives input signal 102 and generates input power signal 105 which represents a product of a gain and a sum of the square of input signal 102 and an offset value. Input power signal 105 may represent the instantaneous power of input signal 102. Similarly, reference squarer 108 receives reference signal 106 and generates reference power signal 109, representing a product of a gain and a sum of the square of reference signal 106 and an offset value. Reference power signal 109 may represent the instantaneous power of reference signal 106. Reference signal 106 is a known reference voltage that is independent of temperature and voltage variations and may be generated by a bandgap circuit.

The integrating ADC may be implemented by a dual-slope ADC, which includes integration module 114 and zero crossing comparator 118. The integrating ADC operates by first resetting the voltage at the output of integration module 114 to zero at the beginning of a measurement cycle. Signal switch 110 under control of a controller 122 is closed at the beginning of the measurement cycle to allow integration module 114 to integrate the voltage or current of input power signal 105. Integration module 114 performs an integration of input power signal 105 over an integration interval to provide integrator output signal 116 at an output terminal of integration module 114. This integration interval is generally known as the "runup interval" and is under the control of controller 122. The runup interval may be selected based on the statistics of input signal 102. At the end of the runup interval, controller 122 opens signal switch 110. The voltage of integrator output signal 116 at the end of the runup interval represents the integration of input power signal 105 over the runup interval.

To measure the voltage of integrator output signal 116 at the end of the runup interval, a discharge of the voltage of integrator output signal 116 is performed in an operation known as "de-integration", using a reference voltage that is opposite in polarity to the voltage to be measured. The interval of the de-integration is generally known as the "rundown interval" and is proportional to the voltage of integrator output signal 116 at the start of the rundown interval. In one embodiment, the reference voltage for de-integration may be provided by reference power signal 109. However, because both the voltage of integrator output signal 116 and the voltage of reference power signal 109 are positive, and therefore of the same polarity, reference power signal 109 is sign-inverted by an inverter circuit 111 to generate a negative reference power signal 113.

During de-integration, controller 122 closes reference switch 112 to provide negative reference power signal 113 to integration module 114. The voltage of integrator output signal 116 discharges at a rate that is proportional to the voltage of negative reference power signal 113. This rate of discharge is often different from the rate at which the voltage of integrator output signal 116 builds up during the integration of input power signal 105 in the runup interval, hence the name "dual-slope ADC".

Zero crossing comparator 118 generates zero crossing signal 120 based on detecting a zero crossing in the voltage of integrator output signal 116; Zero crossing comparator 118 generates a pulse on zero crossing signal 120 to indicate to controller 122 that the voltage of integrator output signal 116 has decreased to zero. When zero crossing signal 120 indicates a zero crossing, controller 122 opens reference switch 112.

Figure 3:
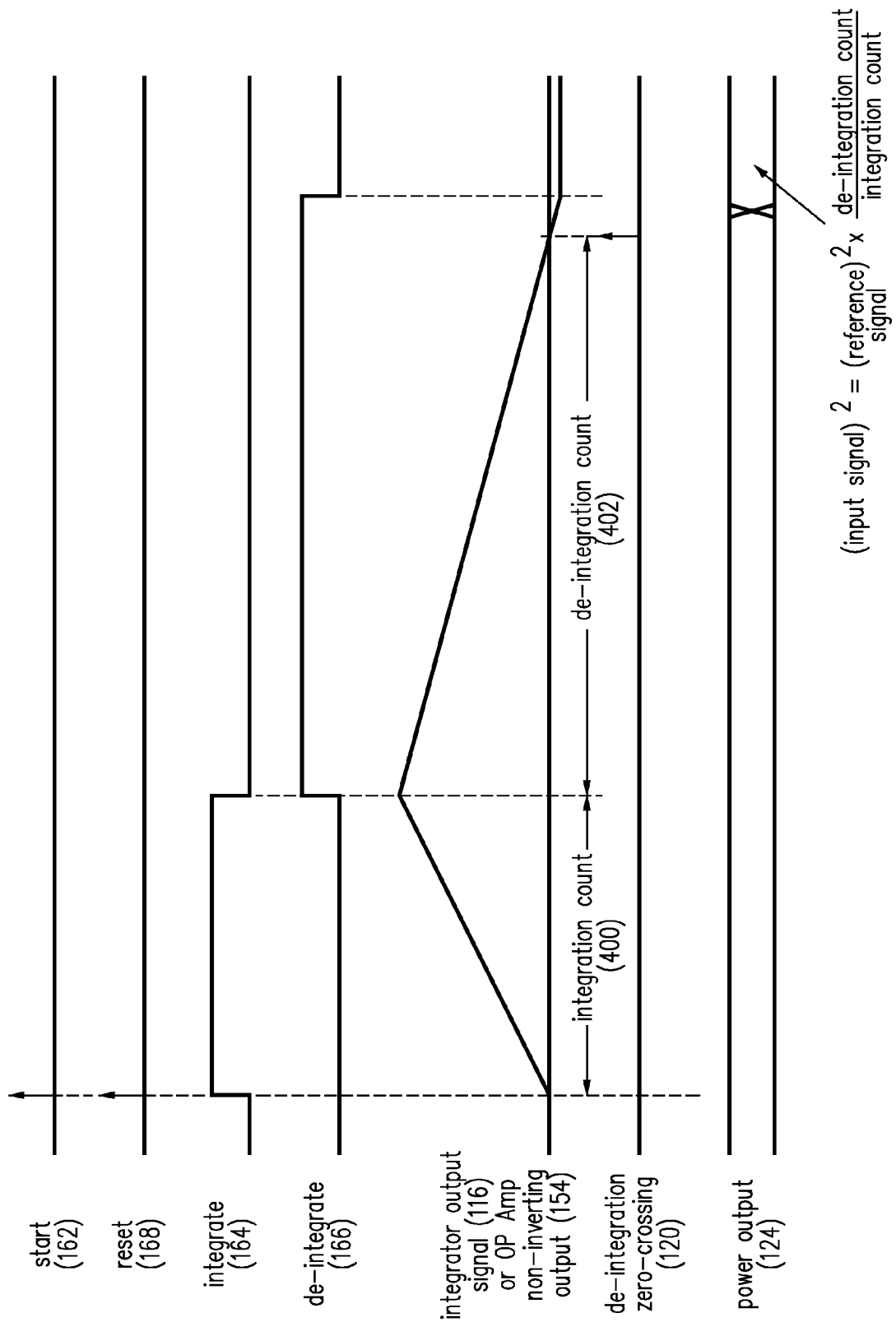
FIG. 3 shows a timing diagram of the integration interval and the de-integration interval of the integration module 114 of FIG. 1 or the integration ADC of FIG. 2, according to one or more embodiments of the present invention.

FIG. 3 shows a timing diagram of the runup interval and the rundown interval of the integration module 114 of FIG. 1, according to one or more embodiments of the present invention. At the beginning of a measurement cycle, the voltage of integrator output signal 116 is reset to zero by a reset signal 168. During the runup interval, an integration of input power signal 105 is performed as indicated by the increasing voltage of integrator output signal 116. At the end of the runup interval, the voltage of integrator output signal 116 represents the integration of input power signal 105 over the runup interval. During the rundown interval, a de-integration of the voltage of integrator output signal 116 is performed as indicated by the decreasing voltage. When the voltage of integrator output signal 116 crosses zero, a pulse is generated on zero crossing signal 120 for controller 122 to terminate the rundown interval.

Denoting input power signal 105 by $V_{sig\_power}$, the voltage of integrator output signal 116 by $V_{int\_output}$, and the runup duration by runup, at the end of the runup interval, $V_{int\_output}$ is provided by:

$$V_{int\_output} = \int_0^{runup} V_{sig\_power} dt \qquad (Eq.\ 1)$$

Denoting reference power signal 109 by $V_{ref\_power}$, and using $\tau$ to represent the elapsed time from the start of the rundown interval, during the rundown interval, $V_{int\_output}$ is provided by:

$$V_{int\_output} = \int_0^{runup} V_{sig\_power} dt - \int_0^{\tau} V_{ref\_power} dt \qquad (Eq.\ 2)$$

When $V_{int\_output}$ reaches zero at the end of the rundown interval, and denoting the rundown duration by rundown, Eq. 2 becomes:

$$\int_0^{runup} V_{sig\_power} dt = \int_0^{rundown} V_{ref\_power} dt \qquad (Eq.\ 3)$$

$V_{sig\_power}$ may be modeled as:

$$V_{sig\_power} = gain_{sig} * [V_{sig}^2 + offset_{sig}] \qquad (Eq.\ 4)$$

where $offset_{sig}$ is an offset value of signal squarer 104 that is added to the square of input signal 102, $V_{sig}$ is the input signal 102, and $gain_{sig}$ is the gain of signal squarer 104. Similarly, $V_{ref\_power}$ may be modeled as:

$$V_{ref\_power} = gain_{ref} * [V_{ref}^2 + offset_{ref}] \qquad (Eq.\ 5)$$

where $offset_{ref}$ is an offset value of reference squarer 108 that is added to the square of reference signal 106, $V_{ref}$ is the reference signal 106, and $gain_{ref}$ is the gain of reference squarer 108. $V_{ref}$ is a constant voltage and is relatively independent of voltage and temperature variations of the power measurement system. However, $V_{ref}$ may be process-dependent. Substituting $V_{sig\_power}$ of Eq. 4 and $V_{ref\_power}$ of Eq. 5 into Eq. 3 and dividing both sides by runup and $gain_{sig}$ yields:

$$\frac{\int_0^{runup} V_{sig}^2 dt}{runup} + offset_{sig} = \qquad (Eq.\ 6)$$
$$(V_{ref}^2 + offset_{ref}) * \left(\frac{gain_{ref}}{gain_{sig}}\right) * \left(\frac{rundown}{runup}\right)$$

Moving $offset_{sig}$ to the right side of Eq. 6 yields:

$$\frac{\int_0^{runup} V_{sig}^2 dt}{runup} = \qquad (Eq.\ 7)$$
$$(V_{ref}^2 + offset_{ref}) * \left(\frac{gain_{ref}}{gain_{sig}}\right) * \left(\frac{rundown}{runup}\right) - offset_{sig}$$

While variations of $V_{ref}$, $offset_{ref}$ and $offset_{sig}$ over temperature and voltage are negligible, and thus $V_{ref}$, $offset_{ref}$ and $offset_{sig}$ are relatively temperature and voltage independent, they may be process-dependent. In addition, while $gain_{ref}$ and $gain_{sig}$ individually is sensitive to PVT variations, the ratio ($gain_{ref}/gain_{sig}$) is relatively independent of temperature and voltage variations. This is because signal squarer 104 and reference squarer 108 are supplied with the same supply voltage and are subject to the same operating temperature. Therefore, individual sensitivities of $gain_{ref}$ and $gain_{sig}$ to temperature and voltage variations cancel out in ($gain_{ref}/gain_{sig}$). Hence, the terms on the right side of the equation of Eq. 7 are independent of temperature and voltage variations and Eq. 7 may now be expressed as:

$$\frac{\int_0^{runup} V_{sig}^2 dt}{runup} = REF_{process} * \left(\frac{rundown}{runup}\right) - offset_{sig} \qquad (Eq.\ 8)$$

where $$REF_{process} = (V_{ref}^2 + offset_{ref}) * \left(\frac{gain_{ref}}{gain_{sig}}\right) \qquad (Eq.\ 9)$$

$REF_{process}$ and $offset_{sig}$ are independent of temperature and voltage variations and are only process-dependent. $REF_{process}$ may also be called the de-integration gain of the power measurement system. The left side of Eq. 8 is the average power of $V_{sig}$ over the runup interval. Both $REF_{process}$ and $offset_{sig}$ may be determined through a one-time calibration procedure. Therefore, by controlling runup, measuring rundown, and performing a calibration procedure for $REF_{process}$ and $offset_{sig}$, controller 122 may calculate the average power of $V_{sig}$ using Eq. 8. Controller 122 may express the average power of $V_{sig}$ in decibel (db) by multiplying the log base 10 of the average power by a factor of 10.

Figure 2:
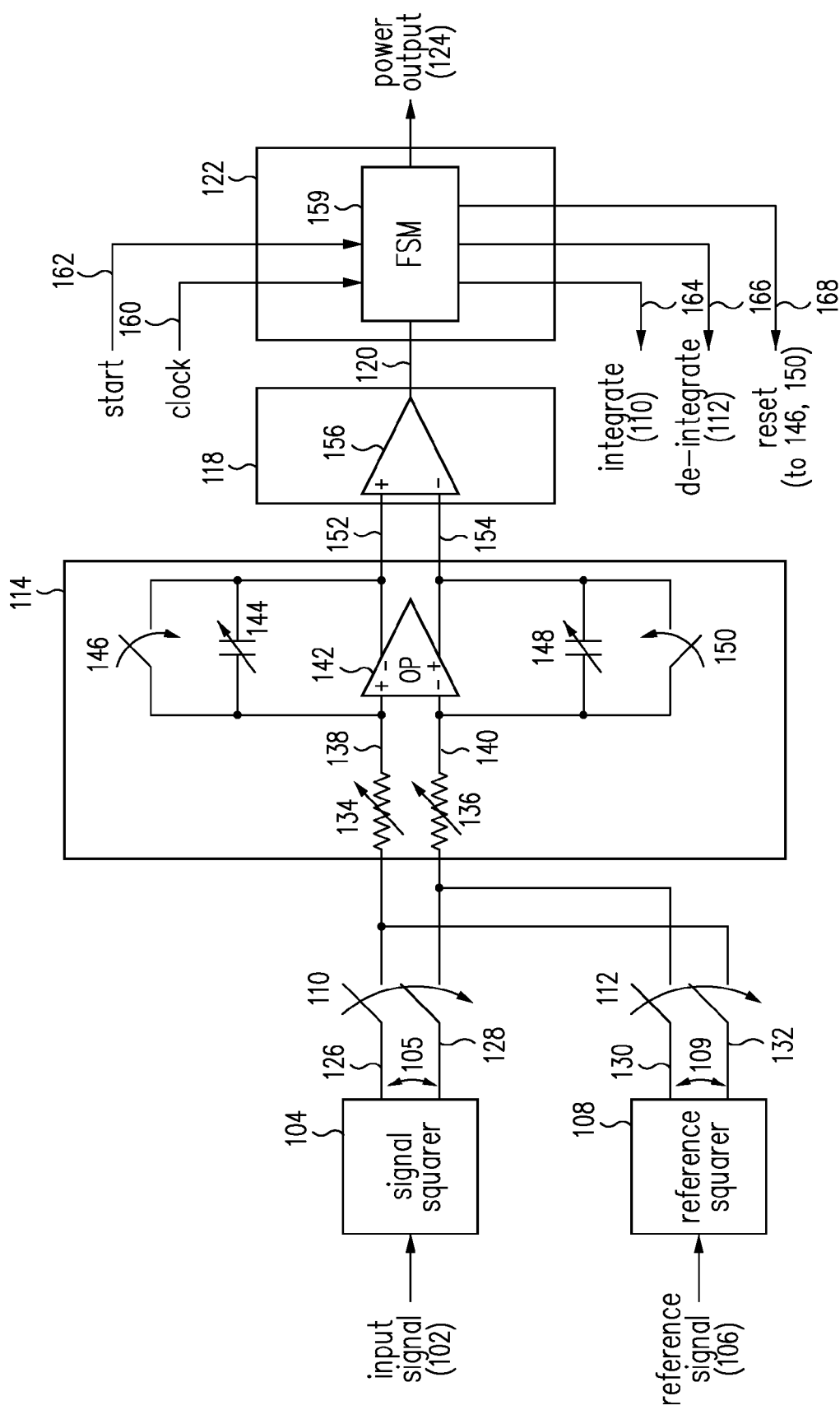
FIG. 2 shows a more detailed implementation of the system of FIG. 1 according to one or more embodiments of the present invention.

FIG. 2 shows a more detailed implementation of the system of FIG. 1 according to one or more embodiments of the present invention. In the current embodiment, signal squarer 104 and reference squarer 108 have differential outputs. For example, signal squarer 104 generates the instantaneous power of input signal 102 as differential input power signal 105 (i.e., the voltage across terminals 126 and 128). The instantaneous power of input signal 102 may be modeled as provided in Eq. 4. Similarly, reference squarer 108 generates the instantaneous power of reference signal 106 as differential reference power signal 109 (i.e., the voltage across terminals 130 and 132). The instantaneous power of reference signal 106 may also be modeled as provided in Eq. 5. Alternatively, signal squarer 104 and reference squarer 108 may have single-ended outputs in other embodiments.

Integration module 114 includes an operational amplifier 142. To integrate differential input power signal 105 during the runup interval and for de-integrating differential reference power signal 109 during the rundown interval, a first variable capacitor 144 is connected across a non-inverting input terminal 138 and an inverting output terminal 152 of operational amplifier 142. Additionally, in the current embodiment, a second variable capacitor 148 is connected across an inverting input terminal 140 and a non-inverting output terminal 154 of operational amplifier 142. Alternatively, in other embodiments, input terminal 138 of operational amplifier 142 may be connected to a voltage ground and variable capacitor 144 eliminated if signal squarer 104 and reference squarer 108 have single-ended outputs. Variable capacitors 144 and 148 integrate differential input power signal 105 by building up charges during the runup interval when signal switch 110 is closed and reference switch 112 is open. Variable capacitors 144 and 148 then de-integrate by discharging the stored charges through differential reference power signal 109 during the rundown interval when signal switch 110 is open and reference switch 112 is closed. To reset the voltages on variable capacitors 144 and 148 at the start of the runup interval, a first reset switch 146 and a second reset switch 150 are connected in parallel with first variable capacitor 144 and second variable capacitor 148, respectively.

In one embodiment, a first variable resistor 134 and a second variable resistor 136 are connected to non-inverting input terminal 138 and inverting input terminal 140 of operational amplifier 142, respectively. First variable resistor 134 and second variable resistor 136 convert the voltage of differential input power signal 105 or the voltage of differential reference power signal 109 to current to charge or discharge first variable capacitor 144 and second variable capacitor 148. The rate of charging or discharging of first variable capacitor 144 is proportional to the inverse of the product of the resistance of first variable resistor 134 and the capacitance of first variable capacitor 144. Similarly, the rate of charging or discharging of second variable capacitor 148 is proportional to the inverse of the product of the resistance of second variable resistor 136 and the capacitance of second variable capacitor 148. These rates may be adjusted by adjusting the capacitance of the variable capacitors 146, 148 and the resistance of the variable resistors 134, 136 to accommodate different runup intervals that may be determined as a function of the statistics of the input signal 102. In other embodiments, signal squarer 104 and reference squarer 108 may output current for the power of input signal 102 and reference signal 106. Input power signal 105 and reference power signal 109 may then be connected directly to operational amplifier 142, and resistors 134, 136 may be eliminated.

Zero crossing comparator 118 includes an analog comparator 156 to receive the differential signal on inverting output terminal 152 and non-inverting output terminal 154 of operational amplifier 142. Analog comparator 156 generates a pulse on zero crossing signal 120 when the differential signal on inverting output terminal 152 and non-inverting output terminal 154 changes sign, to signal the end of the rundown interval. Alternatively, if operational amplifier 142 has a single-ended output, analog comparator 156 may receive the signal from the singled-ended output of operational amplifier 142 on one input terminal and tie the other input terminal to a reference voltage. Controller 122 includes a finite state machine (FSM) 159 that controls the runup interval and monitors the rundown interval of the integration module 114. FSM 159 receives a clock signal 160 and a start signal 162 and generates an integrate signal 164 to control signal switch 110, a de-integrate signal 166 to control reference switch 112, and a reset signal 168 to control first reset switch 146 and second reset switch 150.

Referring back to FIG. 3, which shows a timing diagram of the integration interval and the de-integration interval of the integration ADC of FIG. 2 according to one or more embodiments of the present invention. At the start of the runup interval, FSM 159 receives start signal 162 indicating the start of the measurement cycle. FSM 159 generates a pulse on reset signal 168 to close first reset switch 146 and second reset switch 150 to reset the voltages of variable capacitors 144 and 148 to zero. The voltage on non-inverting output terminal 154 of operational amplifier 142 is thus reset to zero at the start of the runup. FSM 159 starts the runup interval by asserting integrate signal 164 to close signal switch 110.

Referring back to FIG. 2, closing signal switch 110 allows the relatively positive voltage at terminal 126 of signal squarer 104 to charge first variable capacitor 144 from non-inverting input terminal 138 of operational amplifier 142. Charging first variable capacitor 144 from non-inverting input terminal 138 causes the voltage at inverting output terminal 152 of operational amplifier 142 to decrease. Conversely, because of the relatively negative voltage at terminal 128 of signal squarer 104, closing signal switch 110 allows second variable capacitor 148 to charge from non-inverting output terminal 154 of operational amplifier 142. Charging second variable capacitor 148 from non-inverting output terminal 154 causes the voltage of non-inverting output terminal 154 to increase.

Referring back to FIG. 3, the voltage of non-inverting output terminal 154 increases during the runup interval. FSM 159 may determine the runup interval based on the statistics of input signal 102. An integration count 400 may be programmed by FSM 159 to control the runup interval. To monitor the runup duration, FSM 159 may count the number of clock cycles of clock signal 160 during the runup interval. When the runup count reaches integration count 400, FSM 159 terminates the runup interval and deasserts integrate signal 164 to open signal switch 110.

After the runup interval, FSM 159 starts the rundown interval by asserting de-integrate signal 166 to close reference switch 112. To measure the rundown duration, FSM 159 also starts a de-integration counter to count the number of clock cycles of clock signal 160 during the rundown interval.

As shown in FIG. 2, the sign-inversion of differential reference power signal 109 for use during de-integration is accomplished by cross connecting the differential reference power signal 109 to the differential inputs terminals 138, 140 of operational amplifier 142. Because a relatively negative voltage at terminal 132 of reference squarer 108 is connected to first variable capacitor 144, first variable capacitor 144 discharges through non-inverting input terminal 138 of operational amplifier 142, through first variable resistor 134 to drive the negative voltage on inverting output terminal 152 of operational amplifier 142 toward zero (e.g., common mode). Conversely, because a relatively positive voltage at terminal 130 is connected to second variable capacitor 148, second variable capacitor 148 charges from inverting input terminal 140 of operational amplifier 142 to drive the positive voltage on non-inverting output terminal 154 of operational amplifier 142 toward zero (e.g., common mode).

Referring back to FIG. 3, the voltage of non-inverting output terminal 154 decreases toward zero during the rundown interval. When the voltage across output terminals of 152 and 154 changes sign, analog comparator 156 generates a pulse on zero crossing signal 120 to signal the end of the rundown interval. Upon receiving the pulse on zero-crossing signal 120, FSM 159 stops the de-integration counter. A de-integration count 402 of the de-integration counter at that time indicates the rundown duration, FSM 159 also deasserts de-integrate signal 166 to open reference switch 112 to terminate the rundown interval. From integration count 400 that indicates the runup duration and de-integration count 402 that indicates the rundown duration, FSM 159 may calculate the average power of input signal 102, as discussed in conjunction with Eq. 8. FSM 159 may output the calculated power on power output signal 124 along with a validity signal to indicate that power output signal 124 has a valid power measurement.

Referring back to FIG. 2, note that because integration module 114 is used for both the runup interval and the rundown interval, sensitivities of analog devices (i.e., operational amplifier 142, variable capacitors 144, 148, and variable resistors 134, 136) to PVT variations are canceled when rundown is divided by runup as part of the average power calculation of Eq. 8. Additionally, any sensitivities of $gain_{sig}$ of signal squarer 104 and $gain_{ref}$ of reference squarer 108 to voltage and temperature variations are similarly canceled when $gain_{ref}$ is divided by $gain_{sig}$ in Eq. 9. As discussed in conjunction with Eq. 8, $REF_{process}$ and $offset_{sig}$ are independent of temperature and voltage variations and are only process-dependent. In addition, process variations of $REF_{process}$ and $offset_{sig}$ in Eq. 8 may be determined through a one-time calibration procedure. Therefore, after calibration, the average power of $V_{sig}$ over the runup interval in Eq. 8 is independent of PVT variations.

Figure 4:
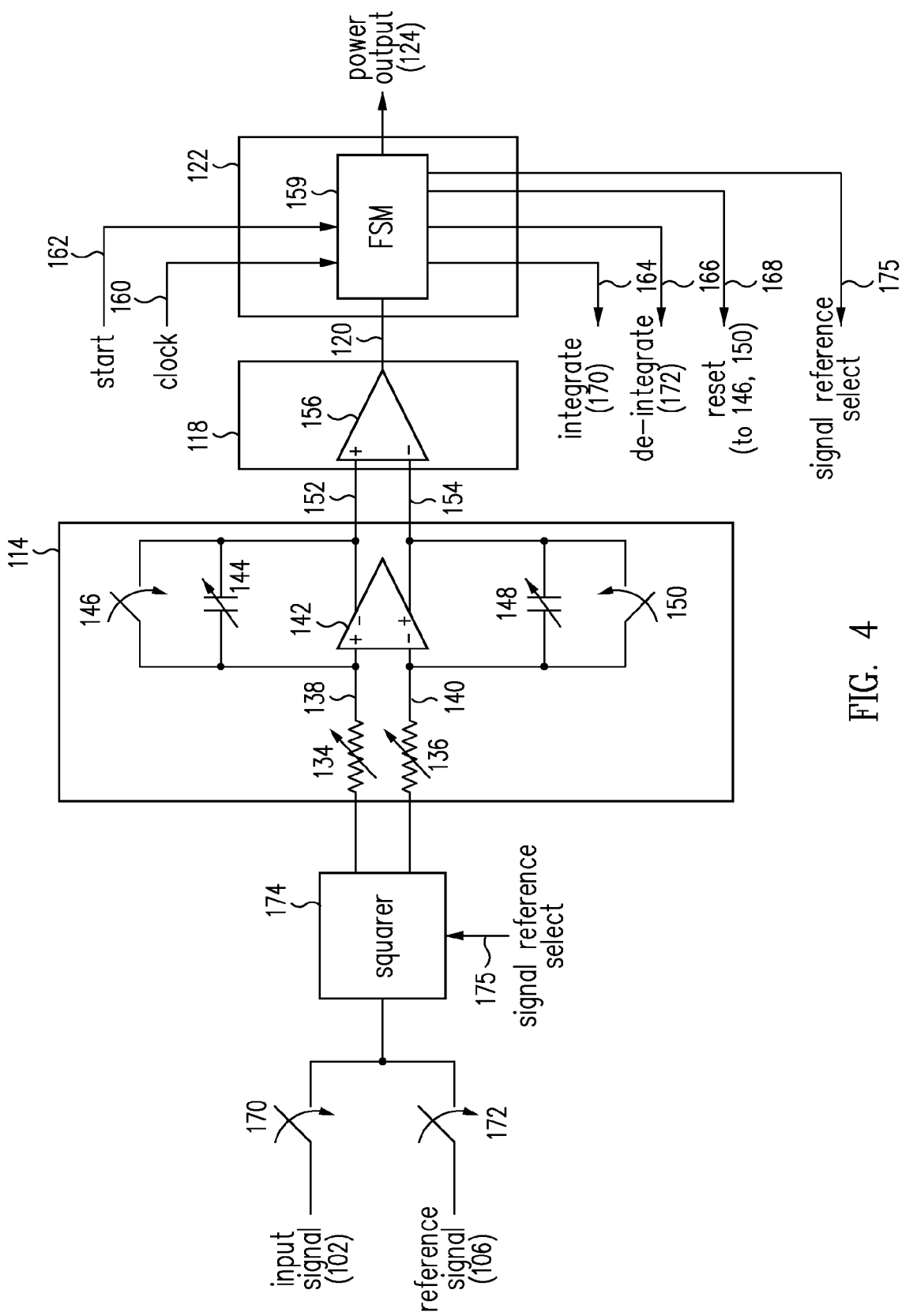
FIG. 4 shows a functional block diagram of a system that is used to generate a power measurement of a signal using a single multiplexed analog squarer circuit and an integrating ADC, according to one or more embodiments of the present invention.

FIG. 4 shows a functional block diagram of a system used to generate a power measurement of a signal using a single multiplexed analog squarer circuit and an integrating ADC, according to one or more embodiments of the present invention. FIG. 4 uses a common squarer 174 to generate both input power signal 105 and reference power signal 109. A signal switch 170 selects input signal 102 during the runup interval and a reference switch 172 selects reference signal 106 during the rundown interval as input to common squarer 174. Common squarer 174 also receives signal/reference select signal 175 from FSM 180 to indicate whether input signal 102 or reference signal 106 is provided to common squarer 174. When operating on input signal 102, common squarer 174 may generate a positive input power signal. Otherwise, i.e., when operating on reference signal 106, common squarer 174 generates the negative reference power signal.

Integration module 114 and zero crossing comparator 108 of FIG. 4 are the same as the corresponding circuitries shown in FIG. 2. FSM 180 generates integrate signal 164 to close signal switch 170 during the runup interval, de-integrate signal 166 to close reference switch 172 during the rundown interval, reset signal 168 to control first reset switch 146 and second reset switch 150 to initialize integrating module 114 before the runup interval, and signal reference select signal 175 to indicate to common squarer 174 whether it is operating on input signal 102 or reference signal 106.

Using common squarer 174, $gain_{sig}$ is equal to $gain_{ref}$ in Eq. 7, which then simplifies to:

$$\frac{\int_0^{runup} V_{sig}^2 \, dt}{runup} = (V_{ref}^2 + offset) * \left(\frac{rundown}{runup}\right) - offset \quad \text{(Eq. 10)}$$

where offset is the offset value of common squarer 174. As before, $V_{ref}$ and offset are relatively independent of temperature and voltage variations, but are process-dependent. Therefore, $[V_{ref}^2+offset]$ and offset may also be determined through a one-time calibration procedure to make the average power of $V_{sig}$ over the runup interval in Eq. 12 PVT independent.

Because signal switch 170 operates directly on input signal 102 to select input signal 102 as the input to common squarer 174 during the runup interval, when input signal 102 is a radio frequency (RF) signal, input signal 102 experiences frequency dependent attenuation introduced by signal switch 170. Furthermore, because reference signal 106 is static and thus does not experience the same frequency dependent attenuation introduced by reference switch 172, the performance of the power measurement system of FIG. 4 may be degraded. In contrast, signal switch 110 of FIG. 1 or 2 operates on the output of signal squarer 104. Squaring an RF input signal 102 shifts the frequency spectrum of input signal 102 to baseband and also to a higher frequency harmonic that is twice the RF carrier frequency. This higher frequency harmonic may be filtered out, leaving the baseband component of $V^2_{sig}$ for signal switching by signal switch 110. In addition, any frequency dependent attenuation introduced by signal switch 110 on the baseband component of $V^2_{sig}$ may be filtered out, leaving the baseband component of $V^2_{sig}$ relatively uncorrupted for power measurement. Therefore, it may be more desirable to have separate analog squarer circuits for input signal 102 and reference signal 106, and to perform signal switching at the output of the squarer circuit for input signal 102 as shown in FIG. 1 or 2 so as to avoid frequency dependent attenuation of the baseband component of $V^2_{sig}$.

Figure 5:
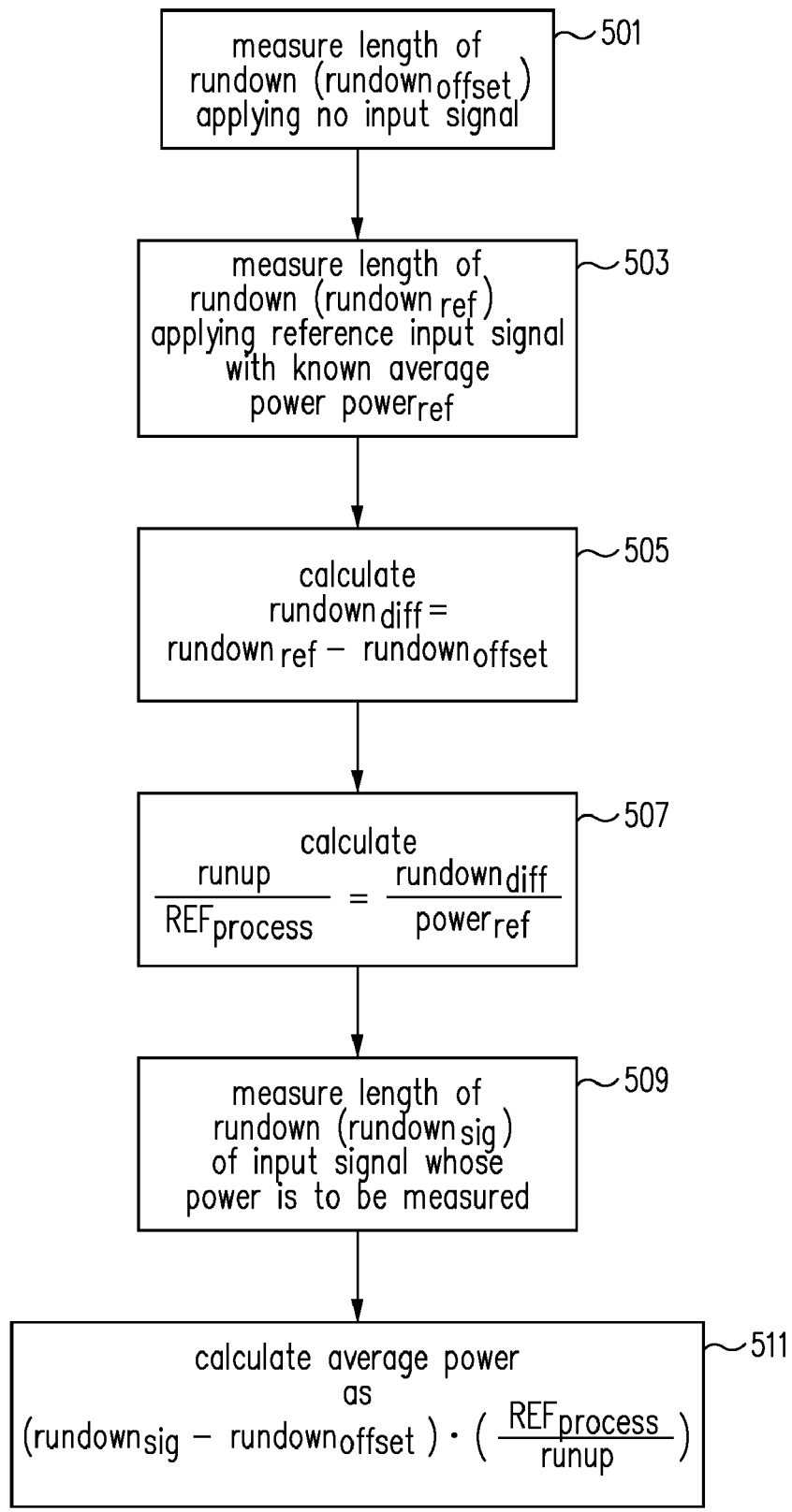
FIG. 5 shows a method for calibrating process-dependent gains and offsets of the replica analog squarer circuits of FIG. 2, so as to make the power measurement independent of process variations, according to one or more embodiments of the present invention.

FIG. 5 shows a method of calibrating the $REF_{process}$ and the $offset_{sig}$ of Eq. 8 to remove the dependency of the power measurement of FIG. 2 on process variations according to one or more embodiments of the present invention. In step 501, input signal 102 is forced to a known calibration voltage such as zero. FSM 159 controls the runup duration runup and measures the rundown duration rundown. This rundown value is designated $rundown_{offset}$, and is related to the $offset_{sig}$. Substituting 0 for $V_{sig}$ into Eq. 8 and rearranging, $rundown_{offset}$ may be expressed as:

$$rundown_{offset} = \left(\frac{runup}{REF_{process}}\right) * offset_{sig} \quad \text{(Eq. 11)}$$

Both $REF_{process}$ and $offset_{sig}$ are unknown. Therefore, to calculate either $REF_{process}$ or $offset_{sig}$ a baseline signal with a known average power, $power_{base}$ is applied on input signal 102 in step 503. FSM 159 controls runup to be the same as runup in step 501 and measures rundown due to the baseline signal. This rundown value is designated $rundown_{base}$. Substituting power$_{base}$ into the left side of Eq. 8, rundown$_{base}$ may be expressed as:

$$rundown_{base} = \left(\frac{runup}{REF_{process}}\right) * (power_{base} + offset_{sig}) \quad \text{(Eq. 12)}$$

In step 505, FSM 159 subtracts rundown$_{offset}$ from rundown$_{base}$ to generate a value rundown$_{diff}$ that is the difference in the rundown durations measured in steps 501 and 503. Using Eq. 11 and Eq. 12, rundown$_{diff}$ may be expressed as:

$$rundown_{diff} = \quad \text{(Eq. 13)}$$
$$rundown_{base} - rundown_{offset} = \left(\frac{runup}{REF_{process}}\right) * power_{base}$$

Note that Eq. 13 does not contain the offset$_{sig}$ value anymore. Therefore, FSM 159 may calculate REF$_{process}$ from rundown$_{diff}$, power$_{base}$, and runup using Eq. 13. After calculating REF$_{process}$, FSM 159 may then calculate offset$_{sig}$ using Eq. 11:

$$offset_{sig} = REF_{process} * \left(\frac{rundown_{offset}}{runup}\right) \quad \text{(Eq. 14)}$$

Instead of calculating REF$_{process}$, in step 507 FSM 159 may calculate (runup/REF$_{process}$) From Eq. 13, (runup/REF$_{process}$) may be calculated by:

$$\left(\frac{runup}{REF_{process}}\right) = \left(\frac{rundown_{diff}}{power_{base}}\right) \quad \text{(Eq. 15)}$$

After calibrating (runup/REF$_{process}$), the average power of a signal whose power is to be measured may be obtained. In step 509, the average power of input signal 102 is measured. FSM 159 controls runup to be the same as those of steps 501 and 503, and measures rundown as rundown$_{sig}$. From rundown$_{sig}$, FSM 159 calculates the average power of input signal 102 in step 511. Substituting Eq. 14 for offset$_{sig}$ into Eq. 8, the average power of input signal 102 may be expressed as:

$$\frac{\int_0^{runup} V_{sig}^2 \, dt}{runup} = \quad \text{(Eq. 16)}$$
$$REF_{process} * \left(\frac{rundown_{sig}}{runup}\right) - REF_{process} * \left(\frac{rundown_{offset}}{runup}\right)$$

Regrouping terms, Eq. 16 becomes:

$$\frac{\int_0^{runup} V_{sig}^2 \, dt}{runup} = (rundown_{sig} - rundown_{offset}) * \left(\frac{REF_{process}}{runup}\right) \quad \text{(Eq. 17)}$$

(REF$_{process}$/runup) is the inverse of Eq. 15 from the calibration procedure. Therefore, the average power of input signal 102 over runup may be calculated from Eq. 17 and Eq. 15.

Substituting (run/REF$_{process}$) of Eq. 15 into Eq. 17, the average power may also be expressed in decibel (dB) as:

$$\frac{\int_0^{runup} V_{sig}^2 \, dt}{runup} = 10 * \log_{10}(rundown_{sig} - rundown_{offset}) - \quad \text{(Eq. 18)}$$
$$10 * \log_{10}\left(\frac{rundown_{diff}}{power_{base}}\right)$$

The various components described herein may be implemented with appropriate hardware, software, or both to perform the various operations described herein. For example, in various embodiments, such components may include one or more processors, logic devices, memories, non-transitory machine readable instructions (e.g., software, firmware, or other instructions stored in a memory or a machine readable medium), and/or other components as may be desired in particular implementations.

Where applicable, various embodiments provided by the present disclosure can be implemented using hardware, software, or combinations of hardware and software. Also where applicable, the various hardware components or software components set forth herein can be combined into composite components comprising software, hardware, or both without departing from the present disclosure. Where applicable, the various hardware components or software components set forth herein can be separated into sub-components comprising software, hardware, or both without departing from the present disclosure. In addition, where applicable, it is contemplated that software components can be implemented as hardware components, and vice-versa.

Software in accordance with the present disclosure, such as program code or data, can be stored on one or more non-transitory machine readable media. It is also contemplated that software identified herein can be implemented using one or more general purpose or specific purpose computers or computer systems, networked or otherwise. Where applicable, the ordering of various steps described herein can be changed, combined into composite steps, or separated into sub-steps to provide features described herein.

Embodiments described above illustrate but do not limit the invention. It should also be understood that numerous modifications and variations are possible in accordance with the principles of the present invention. For example, the dynamic range of the power measurement may be increased by adding multiple instances of the power measurement circuits in parallel with each of the power measurement circuit having a different gain. Alternatively, the integrating ADC may be implemented by a standard ADC followed by digital signal processing in lieu of the dual-slope ADC. Accordingly, the scope of the invention is defined only by the following claims.

What is claimed is:

1. An apparatus comprising:
   a signal squarer module adapted to generate a power of an input signal;
   a reference squarer module adapted to generate a power of a reference signal;
   a signal switch adapted to provide the power of the input signal to an integration module during a programmable runup interval;
   a reference switch adapted to provide the power of the reference signal to the integration module during a rundown interval following the runup interval;
   the integrating module adapted to integrate the power of the input signal over the runup interval to build up an integrated voltage and to receive a negative of the power of the reference signal to de-integrate the integrated voltage over the rundown interval;

a comparator adapted to generate a detect signal when the integrated voltage completely de-integrates over the rundown interval; and a controller adapted to determine and to control the runup interval, to receive the detect signal to measure the rundown interval, and to generate a digital signal proportional to an average power of the input signal over the runup interval.

2. The apparatus of claim 1, wherein the controller is further adapted to close the signal switch to start the runup interval and to open the signal switch to terminate the runup interval.

3. The apparatus of claim 1, wherein the controller is further adapted to close the reference switch after the runup interval to start the rundown interval and to open the reference switch to terminate the rundown interval when the controller receives the detect signal.

4. The apparatus of claim 3, wherein the controller is further adapted to count a number of clocks from the start of the rundown interval to when the controller receives the detect signal to measure the length of the rundown interval.

5. The apparatus of claim 1, wherein the power of the input signal is modeled by a product of a first gain and a sum of a first offset and a square of the input signal, and wherein the power of the reference signal is modeled by a product of a second gain and a sum of a second offset and a square of the reference signal.

6. The apparatus of claim 5, wherein the controller is further adapted to calculate (the rundown interval/the runup interval)*(the power of the reference signal/the first gain)– (the first offset) to generate the digital signal proportional to the average power of the input signal over the runup interval.

7. The apparatus of claim 6, wherein the controller expresses digital signal proportional to the average power of the input signal over the runup interval in decibel.

8. The apparatus of claim 1, wherein the power of the input signal and the power of the reference signal are each provided as a differential signal.

9. The apparatus of claim 8, wherein the integrating module comprises an operational amplifier adapted to receive a differential input and to provide a differential output.

10. The apparatus of claim 9, wherein the integrating module further comprises a first capacitor connected to a non-inverting input and a second capacitor connected to an inverting input of the operational amplifier, wherein the first capacitor and the second capacitor integrate the power of the input signal over the runup interval to build up the integrated voltage and de-integrate the integrated voltage over the rundown interval.

11. The apparatus of claim 10, wherein the integrating module further comprises a first reset switch connected in parallel with the first capacitor and a second reset switch connected in parallel with the second capacitor, and wherein the controller closes the first reset switch and the second reset switch before the runup interval to initialize the integrated voltage to zero.

12. The apparatus of claim 1, wherein the comparator generates the detect signal when the integrated voltage changes sign and wherein the controller measures the rundown interval from a first time instance when the controller closes the reference switch to a second time instance when the controller receives the detect signal.

13. The apparatus of claim 1, wherein the digital signal proportional to the average power of the input signal over the runup interval is independent of process, voltage, and temperature variations of the apparatus.

14. A method comprising:
providing a power measurement system, wherein the power measurement system comprises:

a signal squarer module adapted to generate a power of an input signal, wherein the power of the input signal is dependent on process variations of the signal squarer module;

a reference squarer module adapted to generate a power of a reference signal, wherein the power of the reference signal is dependent on process variations of the reference squarer module; and an integrating analog to digital converter (ADC) adapted to integrate the power of the input signal over a programmable runup interval to build up an integrated voltage, wherein the integrating ADC is further adapted to receive a negative of the power of the reference signal to de-integrate the integrated voltage over a rundown interval, to measure the rundown interval from a start of the rundown interval to when the integrated voltage completely de-integrates, and to calculate an average power of the input signal over the runup interval;

forcing the input signal to a known calibration voltage;

measuring a first rundown interval;

applying a baseline signal having a known average power as the input signal;

measuring a second rundown interval; and generating one or more calibrated parameters using the first rundown interval, the second rundown interval, and the known average power of the baseline signal.

15. The method of claim 14, further comprising:
applying a signal whose power is to be measured as the input signal;
measuring a third rundown interval; and
compensating the third rundown interval using the calibrated parameters to generate the average power of the signal whose power is to be measured.

16. The method of claim 14, wherein the power of the input signal is modeled by a gain of the signal squarer module and an offset of the signal squarer module, and wherein the power of the reference signal is modeled by a gain of the reference squarer module and an offset of the reference squarer module.

17. The method of claim 14, wherein the generating one or more calibrated parameters comprises:
subtracting the first rundown interval from the second rundown interval to generate a first rundown interval difference; and
dividing the first rundown interval difference by the known average power of the baseline signal to generate the calibrated parameter.

18. The method of claim 17, further comprising:
applying a signal whose signal is to be measured as the input signal;
measuring a third rundown interval; and
subtracting the first rundown interval from the third rundown interval to generate a second runtime interval difference;
multiplying the second runtime interval difference by an inverse of the calibrated parameter to generate the average power of the signal.

19. The method of claim 18, wherein the average power of the signal is independent of process, voltage, and temperature variations of the power measurement system.

20. A machine readable medium adapted to store a plurality of non-transitory machine readable instructions which when executed by one or more processors of a device are adapted to cause the device to:
connect to a power measurement system, wherein the power measurement system is adapted to integrate a power of an input signal over a known runup interval to build up an integrated voltage, and to apply a reference signal to de-integrate the integrated voltage over a rundown interval;

force the input signal to a known calibration voltage;
measure a first rundown interval;
apply a baseline signal having a known average power as the input signal;
measure a second rundown interval;
generate a calibrated parameter using the first rundown interval, the second rundown interval, and the known average power of the baseline signal;

apply a third signal as the input signal;
measure a third rundown interval; and
generate an average power of the third signal using the third rundown interval and the calibrated parameter, wherein the average power is independent of process variations of the power measurement system.

* * * * *